United States Patent
Narisawa

(10) Patent No.: US 9,922,923 B2
(45) Date of Patent: Mar. 20, 2018

(54) METHOD OF MANUFACTURING WIRING SUBSTRATE AND WIRING SUBSTRATE

(71) Applicant: KABUSHIKI KAISHA EASTERN, Chino-shi, Nagano (JP)

(72) Inventor: Yoshiaki Narisawa, Chino (JP)

(73) Assignee: KABUSHIKI KAISHA EASTERN, Chino-shi (JP)

( * ) Notice: Subject to any disclaimer, the term of this patent is extended or adjusted under 35 U.S.C. 154(b) by 0 days.

(21) Appl. No.: 15/316,589

(22) PCT Filed: May 15, 2015

(86) PCT No.: PCT/JP2015/064044
§ 371 (c)(1),
(2) Date: Dec. 6, 2016

(87) PCT Pub. No.: WO2016/002360
PCT Pub. Date: Jan. 7, 2016

(65) Prior Publication Data
US 2017/0148717 A1    May 25, 2017

(30) Foreign Application Priority Data
Jul. 4, 2014   (JP) .................................. 2014-138850

(51) Int. Cl.
*H01B 13/00*   (2006.01)
*H01L 23/498*   (2006.01)
(Continued)

(52) U.S. Cl.
CPC .... *H01L 23/49838* (2013.01); *H01L 21/4846* (2013.01); *H01L 23/49894* (2013.01); *H01L 23/562* (2013.01)

(58) Field of Classification Search
USPC .......................................................... 216/13
See application file for complete search history.

(56) References Cited

U.S. PATENT DOCUMENTS

| 6,217,987 B1 | 4/2001 | Ono et al. |
| 2009/0201657 A1 | 8/2009 | Tanaka et al. |

(Continued)

FOREIGN PATENT DOCUMENTS

| JP | 2001-133974 A | 5/2001 |
| JP | 2001-267452 A | 9/2001 |

(Continued)

OTHER PUBLICATIONS

International Search Report for for PCT/JP2015/064044 (PCT/ISA/210) dated Aug. 4, 2015.

*Primary Examiner* — Roberts Culbert
(74) *Attorney, Agent, or Firm* — Birch, Stewart, Kolasch & Birch, LLP

(57) ABSTRACT

To provide a technique capable of easily forming a resin opening of a desired shape. As a solution, a base is prepared which has a first surface region and a second surface region around the first surface region, and which has a wiring formed thereon. Subsequently, a resist which covers the first surface region is formed. Then, the first surface region and the second surface region are covered with a resin body such that the resist is included therein, and the resist is exposed from the resin body. After that, the exposed resist is removed, so that a resin opening that exposes the base in the first surface region is formed in the resin body.

7 Claims, 6 Drawing Sheets

(51) Int. Cl.
*H01L 21/48* (2006.01)
*H01L 23/00* (2006.01)

(56) References Cited

U.S. PATENT DOCUMENTS

2010/0139962 A1 6/2010 Kaneko
2013/0329391 A1 12/2013 Ishizuka

FOREIGN PATENT DOCUMENTS

| JP | 2009-194079 A | 8/2009 |
| JP | 2010-141018 A | 6/2010 |
| JP | 2010-199240 A | 9/2010 |
| WO | WO 2009/104506 A1 | 8/2009 |

METHOD OF MANUFACTURING WIRING SUBSTRATE AND WIRING SUBSTRATE

TECHNICAL FIELD

The present invention relates to a technique effectively applied to the technique for manufacturing a wiring substrate.

BACKGROUND ART

Japanese Patent Laid-Open No. 2010-199240 (hereinafter, referred to as "PTL 1") describes the technique for manufacturing a wiring substrate.

CITATION LIST

Patent Literature

PTL 1: Japanese Patent Laid-Open No. 2010-199240

SUMMARY OF INVENTION

Technical Problem

As an increase in density, a decrease in size, and a reduction in thickness of a semiconductor device (semiconductor chip) proceed, a reduction in thickness and an increase in density of a wiring substrate holding the semiconductor device are requested and therefore it is difficult to secure the straightness and rigidity of the wiring substrate. For example, according to the technique described in PTL 1, an insulating resin as an outermost layer of a wiring substrate is closely contacted so as to be able to suppress the warping of a wiring substrate and manufacture a rigid wiring substrate.

However, if the laser radiation such as the technique described in PTL 1 is used in forming a resin opening of a desired shape, such as the connection terminal opening for a semiconductor device, then the productivity becomes poor and it is difficult to reduce cost. Moreover, with the laser irradiation, it is difficult to form a specific shape, for example such as forming a step in an insulating resin of the outermost layer.

It is an object of the present invention to provide a technique capable of easily forming a resin opening of a desired shape. The above-described and other purposes and the new feature of the present invention will become clear from the description of the present specification and the accompanying drawings.

Solution to Problem

The following explains briefly the outline of a typical invention among the inventions disclosed in the present application.

A method of manufacturing a wiring substrate according to an embodiment of the present invention includes the steps of: (a) preparing a base which includes a first surface region and a second surface region around the first surface region and which has a wiring formed thereon; (b) forming a resist which covers the first surface region; (c) covering the first and second surface regions with a resin body so as to include the resist; (d) exposing the resist from the resin body, and (e) forming a resin opening, which exposes the base in the first surface region, in the resin body by removing the exposed resist. Thus, the shape of the resist serves as a mold, which allows the resin opening of a desired shape to be easily formed in the resin body.

In the method of manufacturing a wiring substrate according to the embodiment, preferably, in the step (d), the resin body is used in a semi-cured state and, after the step (d) and before the step (e), the resin body is completely cured. Thus, in the step (d), because the resin body is in a semi-cured state, a part of the resin body may be easily removed to expose the resist. Moreover, in the step (e), because the resin body is in a completely-cured state, the damage which the resin body receives in removing the resist may be reduced.

Moreover, in the method of manufacturing a wiring substrate according to the embodiment, preferably, in the step (b), a photosensitive resin is used as the resist, and in the step (c) a thermosensitive resin is used as the resin body. Thus, the use of different resin materials allows a selection ratio to be increased and the productivity to be improved.

Moreover, in the method of manufacturing a wiring substrate according to the embodiment, preferably, the step (a) prepares the substrate in which an electrode pad electrically connected to the wiring is formed in the first surface region, and the step (e) exposes the electrode pad from the resin opening. Thus, the electrode pad may be easily exposed.

Moreover, the method of manufacturing a wiring substrate according to the embodiment preferably further includes the step of (f), after the step (c) and before the step (d), forming a mask having a first opening above the first surface region, on the resin body. Here, preferably, the step (d) removes the resin body from the first opening until exposing the resist, and after the step (d), the mask is removed. Thus, a specific-shaped resin opening may be formed in the resin body by combining the shape of the resist itself and the shape of the first opening of the mask.

Here, in the step (f), the mask having an area for the resist of the first opening larger than an area of the resist is used, the step (d) removes a portion of the resin body on the resist and a peripheral part of the portion, and the step (e) forms a step in which an opening side of the resin opening is larger than a bottom-face side thereof in the resin opening. Thus, a resin opening with a step may be formed in the resin body.

Moreover, preferably, the step (a) prepares the substrate which further includes a third surface region different from the first surface region and a fourth surface region around the third surface region, the step (c) covers the third and fourth surface regions together with the first and second surface regions with the resin body, the step (f) forms the mask further including a second opening above the third surface region on the resin body, and the step (d) removes the resin body from the second opening so as to form a resin recess in the resin body. Thus, a resin recess in a shape different from that of the resin opening may be formed in the resin body.

A wiring substrate according to an embodiment of the present invention includes: a base having a wiring formed thereon and including, on a surface thereof, an electrode pad electrically connected to the wiring; and a resin body having a resin opening that exposes the electrode pad and formed on the surface of the base. Here, the resin opening includes a first resin opening extending from the surface of the resin body to a predetermined depth, and a second resin opening extending from the predetermined depth to the surface of the base; and in the resin opening, a step is formed in which an opening area of the first resin opening is larger than an opening area of the second resin opening. Thus, for example, in connecting a bonding wire to an electrode pad, the bonding wire may be prevented from touching the opening edge of a resin opening and thus a decrease in connection reliability with the electrode pad may be prevented.

Moreover, in the wiring substrate according to an embodiment of the present invention, more preferably the resin body further includes a resin recess extending from the surface of the resin body to the predetermined depth at a position different from the resin opening. Thus, for example, even if a protection material is applied to a semiconductor element mounted on the wiring substrate, the resin recess serves as a dam, which may prevent the protection material from expanding onto a resin body surface other than a mounting region.

Advantageous Effects of Invention

The following explains briefly the effect acquired by the typical invention among the inventions disclosed in the present application.

According to the method of manufacturing a wiring substrate according to an embodiment of the present invention, the shape of the resist serves as a mold, which allows a resin opening of a desired shape to be easily formed in the resin body.

DESCRIPTION OF EMBODIMENTS

In the following embodiments of the present invention, as needed one embodiment is divided into a plurality of sections or the like and described, but in principle these are not mutually-unrelated, and one of them is a modification of a part of or all of another, the detail or the like thereof. Therefore, in all the drawings, the same symbol is attached to a member having the same function to omit the repeated explanation thereof. Moreover, the number of constituent elements (including the number of articles, the values, the amounts, the ranges, or the like) is not limited to a specific number, for example unless otherwise specifically stated or apparently limited to the specific number in principle, and the number may be no less than or no more than the specific number. Moreover, when the shape of an element or the like is referred to, what substantially resembles or is substantially similar to the shape or the like shall be included, for example unless otherwise specifically stated and except the cases where it is considered to be clearly not so in principle.

(First Embodiment)

A method of manufacturing a wiring substrate 10 according to a first embodiment of the present invention will be described with reference to FIG. 1 to FIG. 6. FIG. 1 to FIG. 6 are the schematic cross sectional views of the main portion of the wiring substrate 10 during manufacturing processes according to the present embodiment. Note that electronic components (e.g., a semiconductor element, a chip capacitor, and the like) are mounted on the surface (mounting surface) of the wiring substrate 10 to constitute a semiconductor device (semiconductor package).

Figure 1:
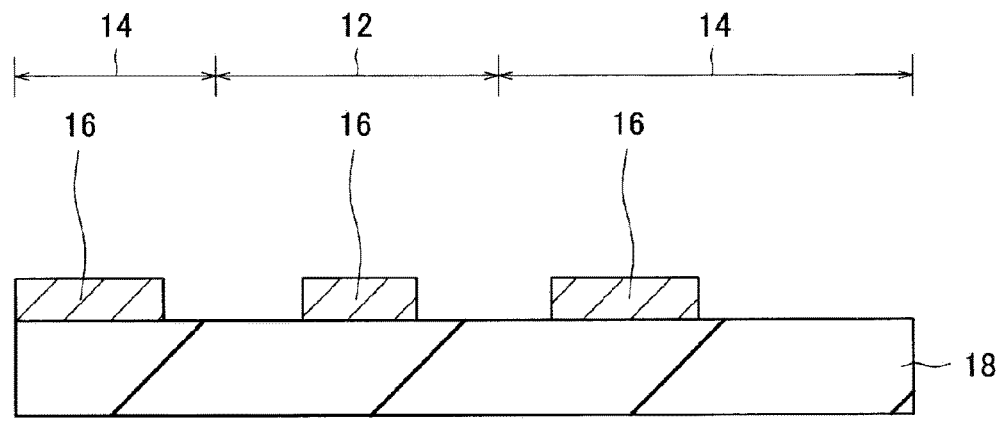
FIG. 1 is a schematic cross sectional view of the main portion of a wiring substrate during manufacturing processes according to a first embodiment of the present invention.

First, as illustrated in FIG. 1, a base 18 is prepared which includes a first surface region 12 and a second surface region 14 around the first surface region 12 and which has a wiring 16 formed thereon. The base 18 is, for example, the so-called core-less substrate, in which a plurality of wiring layers for constituting a circuit between insulating layers without using a core substrate including a glass cloth is electrically connected via a via (a circuit is formed). In the present embodiment, the wiring 16 (e.g., copper wiring) for constituting a first layer of the wiring layer will be described as a top layer (outermost layer) exposed in the surface of the base 18.

The first surface region 12 is, though described later, a region (exposed region) in which a resin opening 24 (see FIG. 6) is formed, while the second surface region 14 serves as a region (coated region) in which the resin opening 24 is not formed. Therefore, the wiring 16 present in the first surface region 12 serves, for example, as an electrode pad (connection terminal) for connecting to an electronic component to be mounted or as an interconnection pattern desired to be exposed to the outside.

Figure 2:
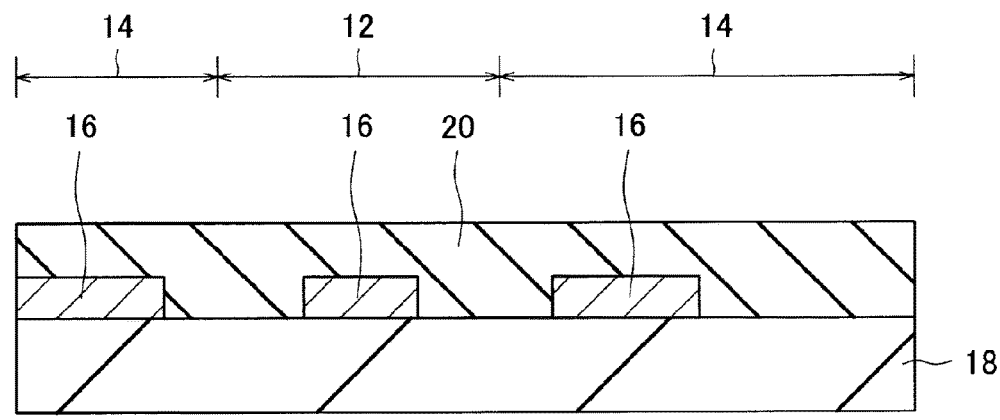
FIG. 2 is a schematic cross sectional view of the main portion of the wiring substrate during manufacturing processes following FIG. 1.

Next, after the base 18 is surface-treated, a resist 20 covering the first surface region 12 and the second surface region 14 is formed as illustrated in FIG. 2. The resist 20 is a photosensitive resist (dry film, liquid resist, or the like), for example. The resist 20 in the form of the dry film is applied (attached) to the surface of the base 18 so as to include (embed) the wiring 16 of the first surface region 12 and the second surface region 14.

Figure 3:
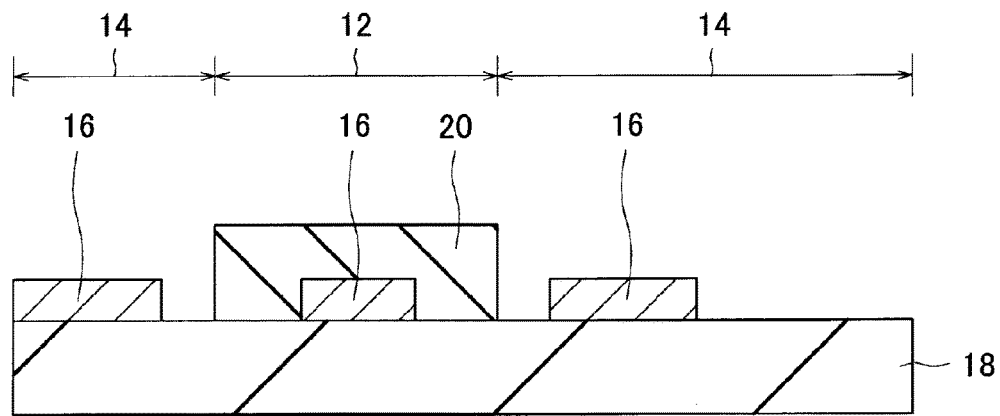
FIG. 3 is a schematic cross sectional view of the main portion of the wiring substrate during manufacturing processes following FIG. 2.

Next, as illustrated in FIG. 3, the resist 20 is patterned to form the resist 20 which covers only the first surface region 12. Specifically, by use of a photolithographic technique and etching technique, exposure and development are performed on the resist 20 in the state illustrated in FIG. 2 to form the patterned resist 20 illustrated in FIG. 3. The shape (e.g., cylindrical shape) of the patterned resist 20 will form the shape of the resin opening 24 formed later. Note that the resist 20 having gone through the exposure and developing processes is completely cured.

Figure 4:
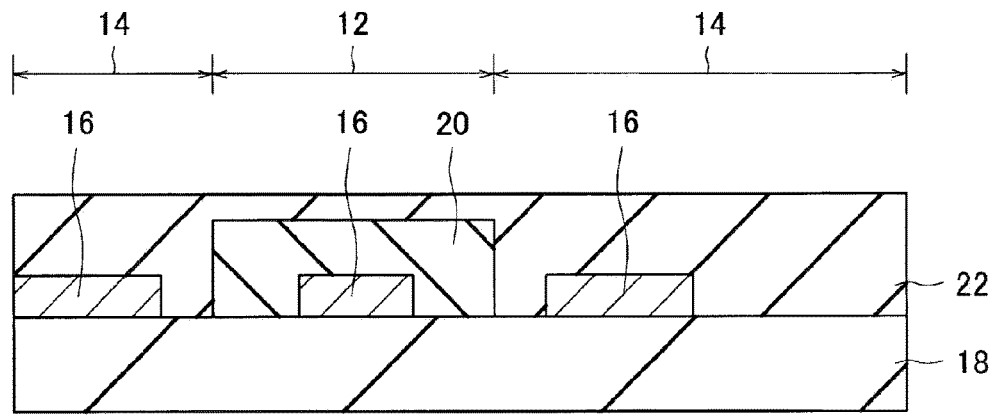
FIG. 4 is a schematic cross sectional view of the main portion of the wiring substrate during manufacturing processes following FIG. 3.

Next, as illustrated in FIG. 4, the first surface region 12 and the second surface region 14 are covered with the resin body 22 so as to include (embed) the resist 20. The resin body 22 is a thermosetting resin (e.g., a thermosetting resin, such as a sheet-shaped epoxy resin or acrylic resin), for example. The resin body 22 of the sheet-shaped thermosetting resin is applied (closely contacted) to the surface of the base 18 so as to include (embed) the resist 20 of the first surface region 12 and the wiring 16 of the second surface region 14, and is then heated so as to become in a semi-cured state (B stage).

Figure 5:
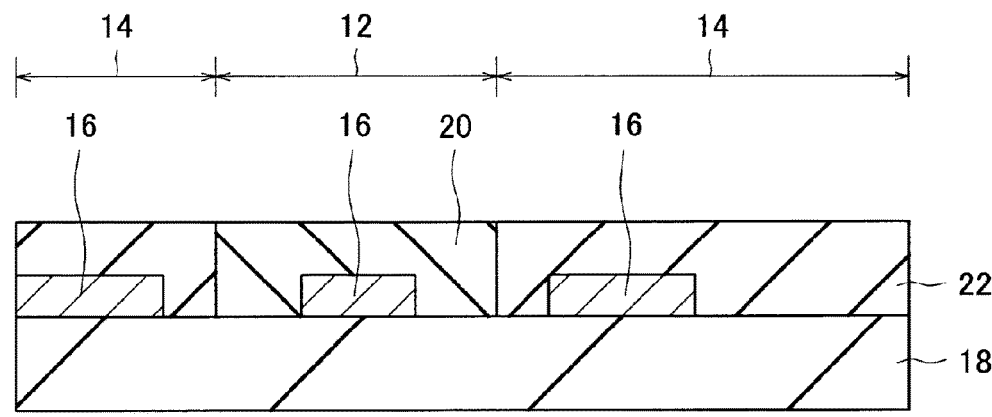
FIG. 5 is a schematic cross sectional view of the main portion of the wiring substrate during manufacturing processes following FIG. 4.

Next, as illustrated in FIG. 5, the resist 20 is exposed from the resin body 22 by physical polishing or chemical polishing, for example. Specifically, by polishing from the surface (upper surface) side of the resin body 22 toward the resist 20 side or by etching using an etchant (if the resin body 22 is an epoxy resin, then a permanganate etchant or the like, for example), the surface (upper surface) of the resist 20 is exposed. Here, because the resin body 22 is in a semi-cured state, a part of the resin body 22 may be easily removed to expose the resist 20.

Next, the resin body 22 in a semi-cured state, in which the resist 20 is exposed, is completely cured. If the resin body 22 is a thermosetting resin, it is thermally cured.

Figure 6:
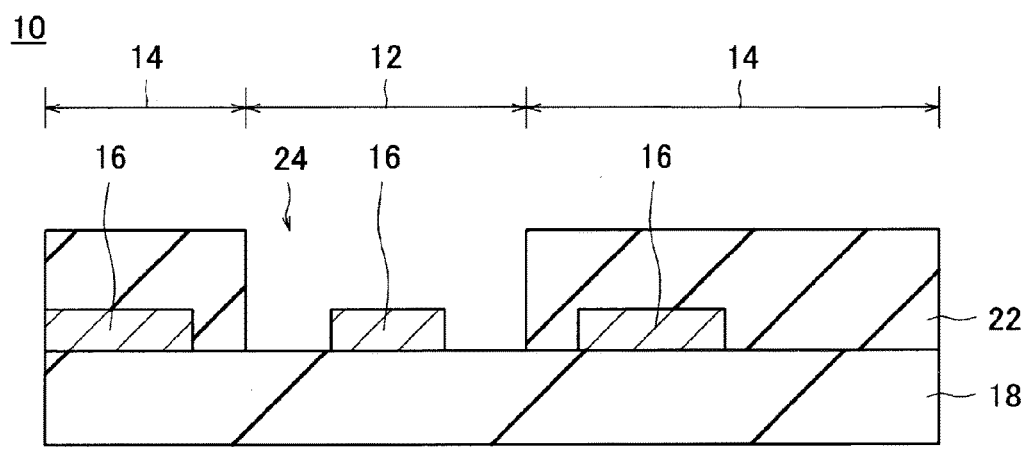
FIG. 6 is a schematic cross sectional view of the main portion of the wiring substrate during manufacturing processes following FIG. 5.

Next, as illustrated in FIG. 6, the exposed resist 20 is selectively removed with respect to the resin body 22 by etching or peeling-off, for example, so that the resin opening 24 for exposing the base 18 in the first surface region 12 is formed in the resin body 22. In the present embodiment, because a photosensitive resin material is used as the resist 20 and a thermosensitive resin material different from the photosensitive resin material is used as the resin body 22, the selection ratio may be increased and the productivity may be improved.

Specifically, by etching using an etchant (if the resist 20 is in the form of a dry film, then ammonia system alkali etching liquid, for example) from the surface (upper surface) side of the resist 20 toward the surface side of the base 18 or by physically peeling-off the resist 20, the first surface region 12 of the base 18 is exposed. Here, because the resin body 22 is in a completely-cured state, the damage which the resin body 22 receives in removing the resist 20 may be reduced.

In this manner, the wiring substrate 10 is substantially completed. In the first surface region 12, the wiring 16 used as an electrode pad is exposed from the resin opening 24 of the resin body 22, for example. Moreover, in the second surface region 14, the wiring 16 protected without being exposed to the outside is included by the resin body 22. That is, according to the present embodiment, because a portion not desired to be exposed in the wiring substrate 10 is covered with the resin body 22 (e.g., epoxy resin) as the surface protection layer of the wiring substrate 10, the wiring substrate 10 whose substrate rigidity is secured and whose warping is suppressed may be provided.

Moreover, according to the present embodiment, because the shape of the resist 20 is the mold of the resin opening 24, the resin opening 24 of a desired shape may be easily formed in the resin body 22 even if the laser machining technique as described in PTL 1 is not used. Then, the wiring 16 of the first surface region 12 serving as an electrode pad may be easily exposed from the resin opening 24.

(Second Embodiment)

A method of manufacturing the wiring substrate 10 according to a second embodiment of the present invention will be described with reference to FIG. 7 to FIG. 11. FIG. 7 to FIG. 11 are the schematic cross sectional views of the main portion of the wiring substrate 10 during manufacturing processes according to the present embodiment.

Figure 7:
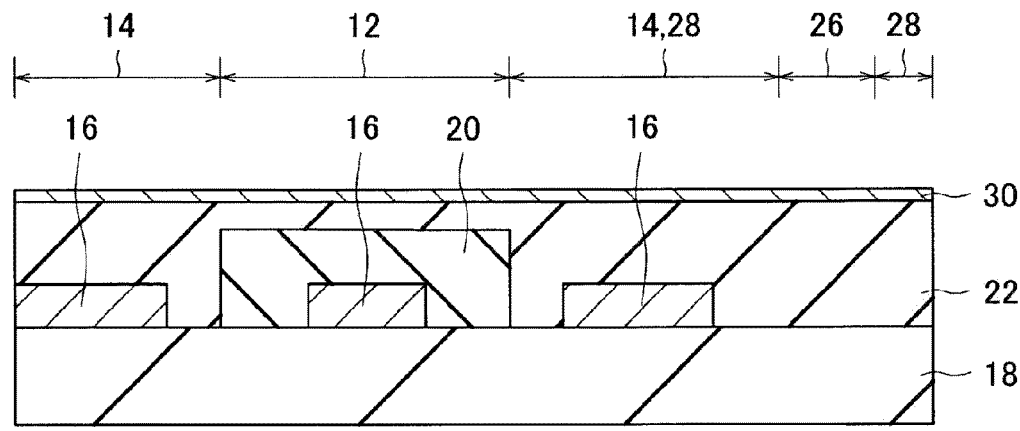
FIG. 7 is a schematic cross sectional view of the main portion of a wiring substrate during manufacturing processes according to a second embodiment of the present invention.

First, as illustrated in FIG. 7, the base 18 is prepared which includes the first surface region 12, the second surface region 14 around the first surface region 12, a third surface region 26 different from the first surface region 12, and a fourth surface region 28 around the third surface region 26 and which has the wiring 16 formed thereon. Here, between the first surface region 12 and the third surface region 26, the second surface region 14 and the fourth surface region 28 overlap with each other. Then, by going through the steps described with reference to FIG. 1 to FIG. 4 in the first embodiment, the resin body 22 covering the first surface region 12, the second surface region 14, the third surface region 26, and the fourth surface region 28 is formed on the surface of the base 18 so as to include the resist 20.

Next, as illustrated in FIG. 7, a mask 30 is formed on the resin body 22. The mask 30 is a metal mask (e.g., made of copper, aluminum, or the like) for example. For example, the mask 30 in the form of a copper foil is applied to the surface of the resin body 22 so as to cover the first surface region 12, the second surface region 14, the third surface region 26, and the fourth surface region 28.

Figure 8:
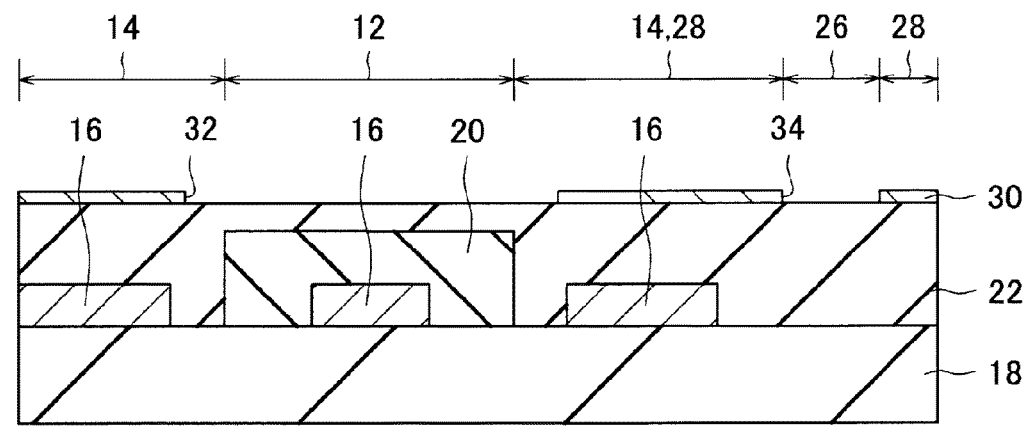
FIG. 8 is a schematic cross sectional view of the main portion of the wiring substrate during manufacturing processes following FIG. 7.

Next, as illustrated in FIG. 8, the mask 30 which includes the first opening 32 of a desired size above the first surface region 12 and the second opening 34 of a desired size above the third surface region 26 is formed on the resin body 22. Specifically, by use of a photolithographic technique (exposure) and an etching technique (development), a guide etch (guide pattern opening) is formed on the mask 30, and then the mask 30 is patterned into a desired shape. Here, the first opening 32 is formed so that the opening area (area with respect to the resist 20) becomes larger than the resist 20 (i.e., the first surface region 12).

Figure 9:
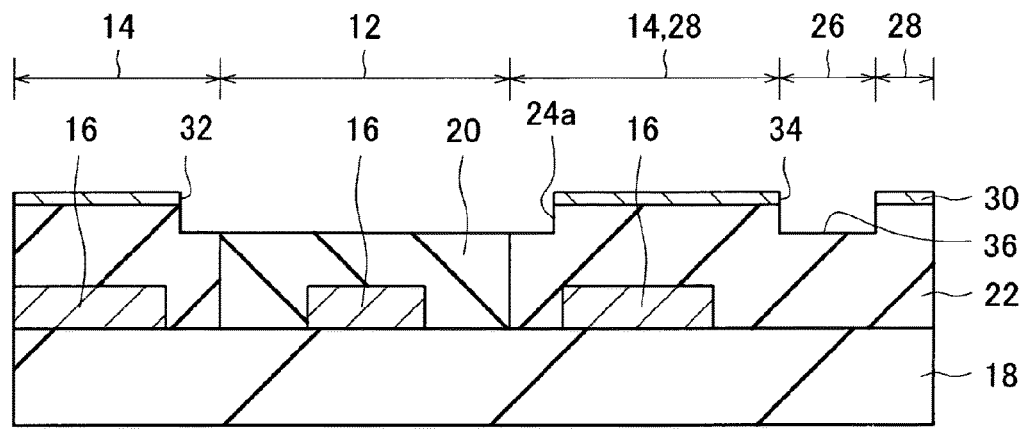
FIG. 9 is a schematic cross sectional view of the main portion of the wiring substrate during manufacturing processes following FIG. 8.

Next, as illustrated in FIG. 9, by use of the mask 30, a part of the resin body 22 is removed from the first opening 32 until the resist 20 is exposed, by physical polishing or chemical polishing, for example. The part of the resin body 22 corresponds to the portion of the resin body 22 on the resist 20 and to the peripheral part thereof. In this case, a part of the resin body 22 is removed also from the second opening 34 to form a resin recess 36 in the resin body 22.

For example, from the surface (upper surface) side of the resin body 22 exposed from the first opening 32 and second opening 34 of the mask 30 toward the resist 20 side, etching is performed using an etchant (if the resin body 22 is an epoxy resin, then a permanganate etchant or the like, for example). Here, because the resin body 22 is in a semi-cured state, a part of the resin body 22 may be easily removed.

Next, the resin body 22 in a semi-cured state, in which the resist 20 is exposed, is completely cured. If the resin body 22 is the thermosetting resin, it is thermally cured.

Figure 10:
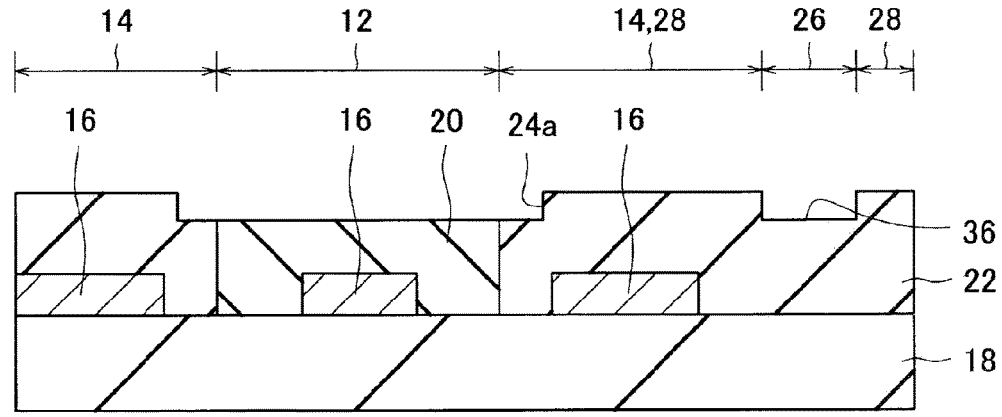
FIG. 10 is a schematic cross sectional view of the main portion of the wiring substrate during manufacturing processes following FIG. 9.

Next, as illustrated in FIG. 10, the mask 30 is removed. If the mask 30 is in the form of a copper foil, it may be removed by etching, for example, using a sulfuric acid hydrogen peroxide-based etchant, a chlorine persulfate-based etchant, or the like.

Figure 11:
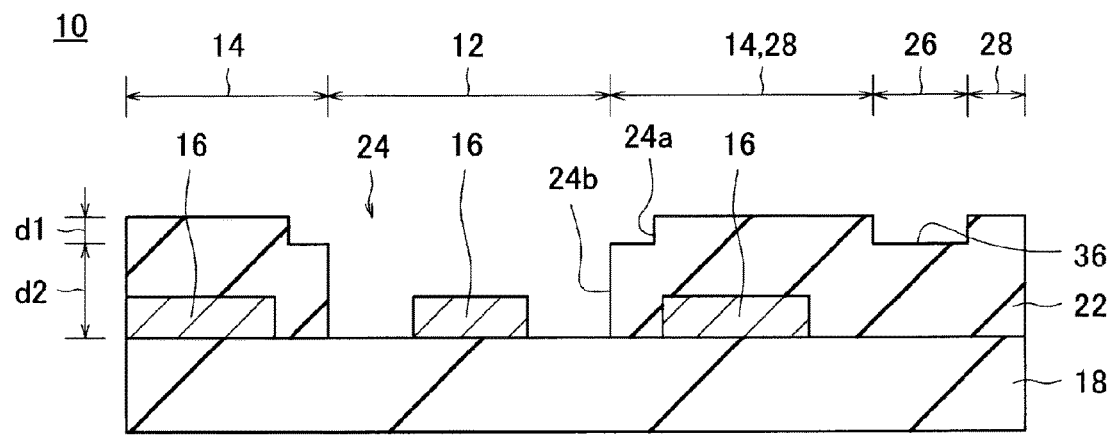
FIG. 11 is a schematic cross sectional view of the main portion of the wiring substrate during manufacturing processes following FIG. 10.

Next, as illustrated in FIG. 11, the exposed resist 20 is selectively removed with respect to the resin body 22 by etching or peeling-off, for example, so that the resin opening 24 for exposing the base 18 in the first surface region 12 is formed in the resin body 22. This step is the same as the step described with reference to FIG. 6 in the first embodiment.

Thus, in the resin opening 24, a step is formed in which an opening side of the resin opening 24 is larger than a bottom-face side thereof in the resin opening 24. Specifically, the resin opening 24 includes a first resin opening 24a extending from the surface of the resin body 22 to a predetermined depth d1 and a second resin opening 24b extending from the predetermined depth d1 to the surface (predetermined depth d2) of the base 18. Then, in the resin opening 24, a step is formed in which the opening area of the first resin opening 24a is larger than the opening area of the second resin opening 24b.

The step shape of the resin opening 24 is controlled by changing the depth at which physical polishing or chemical polishing is performed in the step described with reference to FIG. 9. Moreover, the step shape of the resin opening 24 may be controlled also by the thickness (corresponding to the depth d2) of the resist 20.

In this manner, the wiring substrate 10 is substantially completed. According to the present embodiment, an effect similar to the effect of the first embodiment may be obtained. Moreover, according to the present embodiment, the specific-shaped resin opening 24 may be formed in the resin body 22 by combining the shape of the resist 20 itself and the shape of the first opening 32 of the mask 30.

Moreover, the wiring substrate 10 includes the resin recess 36 extending from the surface of the resin body 22 to the predetermined depth d1 at a position different from the resin opening 24. For example, the resin recess 36 is formed in a characteristic portion without an electrode pad, at a position different from the resin opening 24 where the wiring 16 serving as an electrode pad is exposed. As described above, in the wiring substrate 10, the resin recess 36 of a shape different from the resin opening 24 may be formed in the resin body 22. That is, according to the present embodiment, machining of a specific shape may be performed on the resin body 22 as the surface protection layer of the wiring substrate 10.

Figure 12:
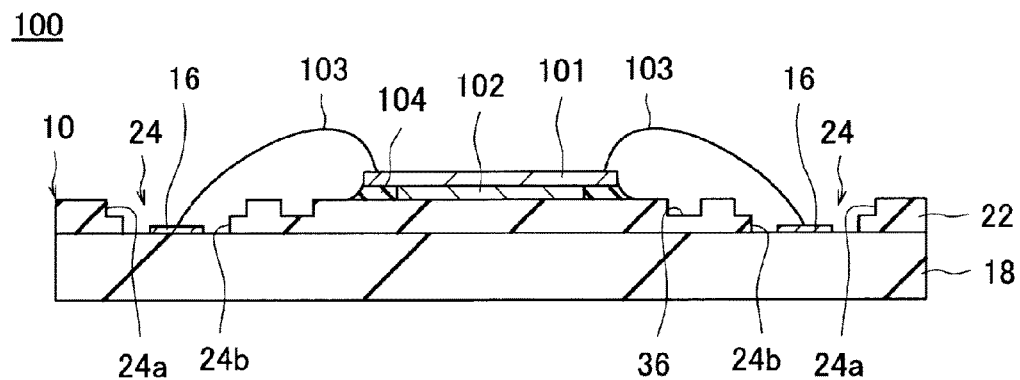
FIG. 12 is a schematic cross sectional view of the main portion of an example of the semiconductor device provided with the wiring substrate according to the second embodiment of the present invention.

Here, a semiconductor device 100 constituted by use of the wiring substrate 10 according to the present embodiment will be described with reference to FIG. 12. FIG. 12 is a schematic cross sectional view of the main portion of an example of the semiconductor device 100 provided with the wiring substrate 10.

In the wiring substrate 10 illustrated in FIG. 12, chip-like semiconductor elements 101 and 102 are mounted in a stacked state in a mounting region. The semiconductor element 101 has a larger chip size than the semiconductor element 102, and thus a space is formed between the surface of the wiring substrate 10 around the semiconductor element 102 and the semiconductor element 101. The wiring substrate 10 includes: the resin recess 36 (circumferential groove) which is formed in a ring shape in a plan view in the periphery of the mounting region; and a plurality of resin openings 24 for exposing the wiring 16 serving as an electrode pad.

The semiconductor element 101 mounted on the wiring substrate 10 is electrically connected to the wiring substrate 10 by connecting the wiring 16 (electrode pad) exposed in the resin opening 24 to an electrode pad (not illustrated) formed on the surface via a bonding wire 103. In the present embodiment, in the resin opening 24, a step is formed in which the opening area of the first resin opening 24a is larger than the opening area of the second resin opening 24b. That is, the opening edge of the resin opening 24 is extended. Therefore, it is possible to prevent the bonding wire 103 from touching at the opening edge of the resin opening 24 in connecting the bonding wire 103 to the wiring 16 (electrode pad), and prevent a decrease in the connection reliability with the wiring 16 (electrode pad).

Then, for the purpose of protecting the mounted semiconductor elements 101 and 102, the protection material 104 is applied (under-filled) so as to fill the space between the surface of the wiring substrate 10 in the mounting region and the semiconductor element 101. In the present embodiment, because the resin recess 36 of a ring shape in a plan view is formed in the wiring substrate 10, the resin recess 36 may serve as a dam to prevent the protection material 104 from expanding to the surfaces other than the mounting region of the wiring substrate 10 (resin body 22).

Figure 13:
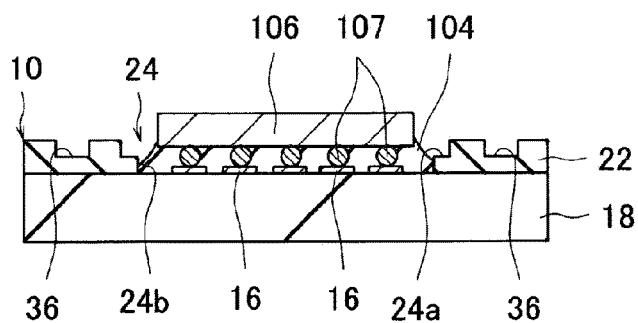
FIG. 13 is a schematic cross sectional view of the main portion of another example of the semiconductor device provided with the wiring substrate according to the second embodiment of the present invention.

Moreover, a semiconductor device 105 constituted by use of the wiring substrate 10 according to the present embodiment will be described with reference to FIG. 13. FIG. 13 is a schematic cross sectional view of the main portion of an example of the semiconductor device 105 provided with the wiring substrate 10.

In the wiring substrate 10 illustrated in FIG. 13, a chip-like semiconductor element 106 is flip-chip mounted in the mounting region. The wiring substrate 10 includes: the resin opening 24 for exposing the mounting region; and the resin recess 36 (circumferential groove) which is formed in a ring shape in a plan view in the periphery of the mounting region.

The semiconductor element 106 mounted on the wiring substrate 10 is electrically connected to the wiring substrate 10 by bonding a plurality of electrode bumps 107 formed in the principal surface (lower surface) and a plurality of wirings 16 (electrode pads) exposed in the resin opening 24. Then, for the purpose of protecting the mounted semiconductor elements 106, the protection material 104 is applied (under-filled) so as to fill the space between the surface of the wiring substrate 10 in the mounting region and the semiconductor element 106.

In the present embodiment, in the resin opening 24, a step is formed in which the opening area of the first resin opening 24a is larger than the opening area of the second resin opening 24b. That is, the opening edge of the resin opening 24 is extended. Therefore, the first resin opening 24a may serve as a dam to prevent the protection material 104 from expanding to the surfaces other than the mounting region of the wiring substrate 10 (resin body 22). Moreover, in the present embodiment, because the resin recess 36 of a ring shape in a plan view is formed in the wiring substrate 10, the resin recess 36 may also serve as a dam to further prevent the protection material 104 from expanding to the surfaces other than the mounting region of the wiring substrate 10 (resin body 22).

(Third Embodiment)

Figure 14:
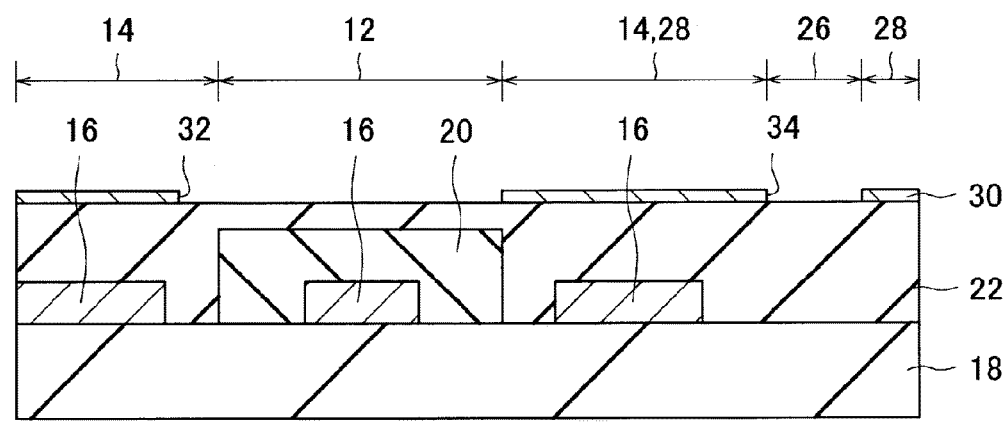
FIG. 14 is a schematic cross sectional view of the main portion of a wiring substrate during manufacturing processes according to a third embodiment of the present invention.
Figure 15:
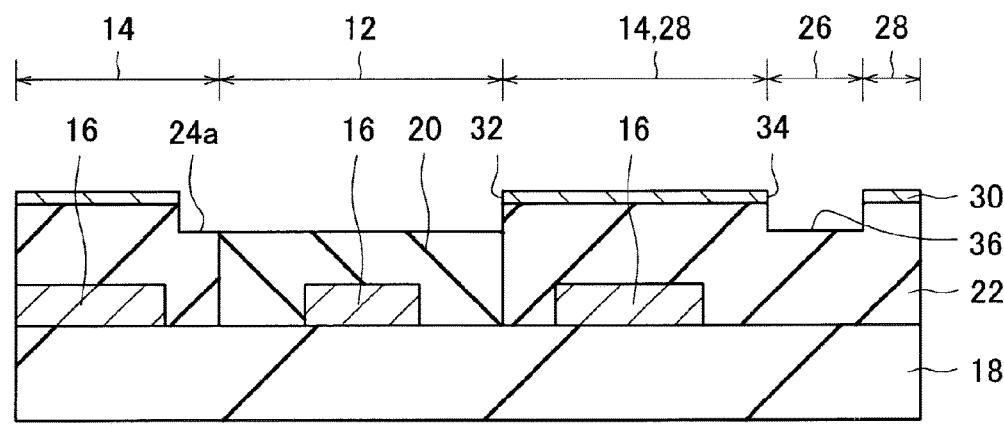
FIG. 15 is a schematic cross sectional view of the main portion of the wiring substrate during manufacturing processes following FIG. 14.
Figure 16:
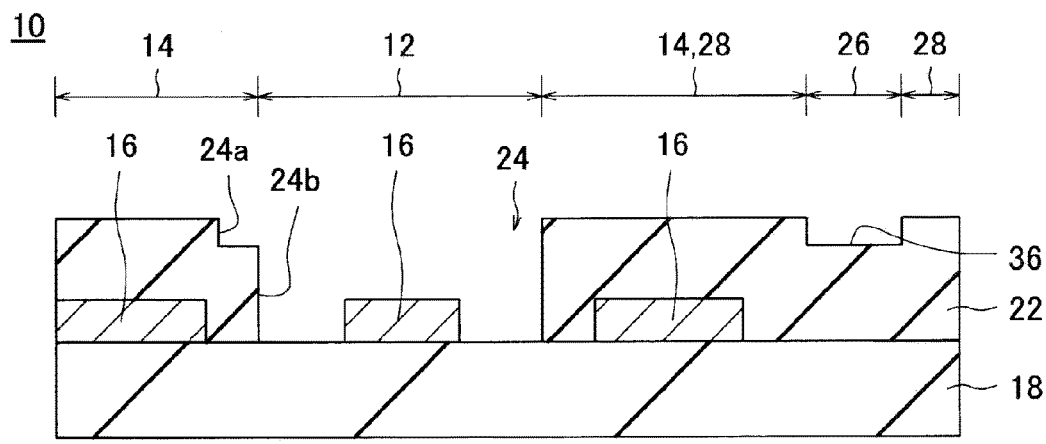
FIG. 16 is a schematic cross sectional view of the main portion of the wiring substrate during manufacturing processes following FIG. 15.

A method of manufacturing the wiring substrate 10 according to a third embodiment of the present invention will be described with reference to FIG. 14 to FIG. 16. FIG. 14 to FIG. 16 are the schematic cross sectional views of the main portion of the wiring substrate 10 during manufacturing processes according to the present embodiment. Note that, because the method of manufacturing the wiring substrate 10 according to the present embodiment goes through the same steps as the steps described with reference to FIG. 7 in the second embodiment, hereinafter the subsequent steps will be described.

As illustrated in FIG. 14, the mask 30 which includes the first opening 32 of a desired size above the first surface region 12 and the second opening 34 of a desired size above the third surface region 26 is formed on the resin body 22. Here, the first opening 32 is formed so that the opening area (area with respect to the resist 20) becomes larger than the resist 20 (i.e., the first surface region 12), while as illustrated in FIG. 14 one inner peripheral surface (inner peripheral surface on the second opening 34 side) of the first opening 32 is formed so as to match one side of the resist 20.

Next, as illustrated in FIG. 15, by use of the mask 30, a part of the resin body 22 is removed from the first opening 32 until the resist 20 is exposed, by physical polishing or chemical polishing, for example, and at the same time a part of the resin body 22 is removed also from the second opening 34. For example, from the surface (upper surface) side of the resin body 22 exposed from the first opening 32 and second opening 34 of the mask 30 toward the resist 20 side, etching is performed by use of an etchant.

Next, the resin body 22 in a semi-cured state in which the resist 20 is exposed is completely cured, and then the mask 30 is removed. Next, as illustrated in FIG. 16, for example, the exposed resist 20 is selectively removed with respect to the resin body 22 by etching or peeling-off, so that the resin opening 24 for exposing the base 18 in the first surface region 12 is formed in the resin body 22. Thus, in a part (only on one side in FIG. 16) of the opening edge of the resin opening 24, a step is formed in which an opening side of the resin opening 24 is larger than a bottom-face side thereof.

In this manner, the wiring substrate 10 is substantially completed. According to the present embodiment, an effect similar to the effect of the first and second embodiments may be obtained. Moreover, according to the present embodiment, a specific-shaped resin opening 24 may be formed in the resin body 22 by combining the shape of the resist 20 itself and the shape of the first opening 32 of the mask 30.

Figure 17:
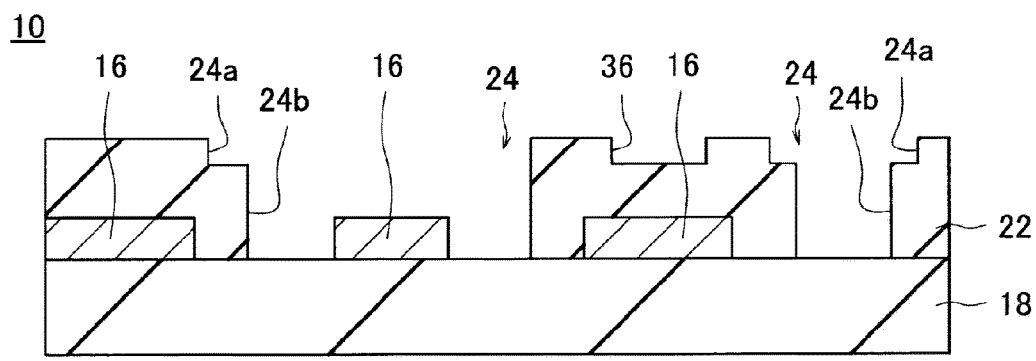
FIG. 17 is a schematic cross sectional view of the main portion of a variation of the wiring substrate according to the third embodiment of the present invention.
Figure 18:
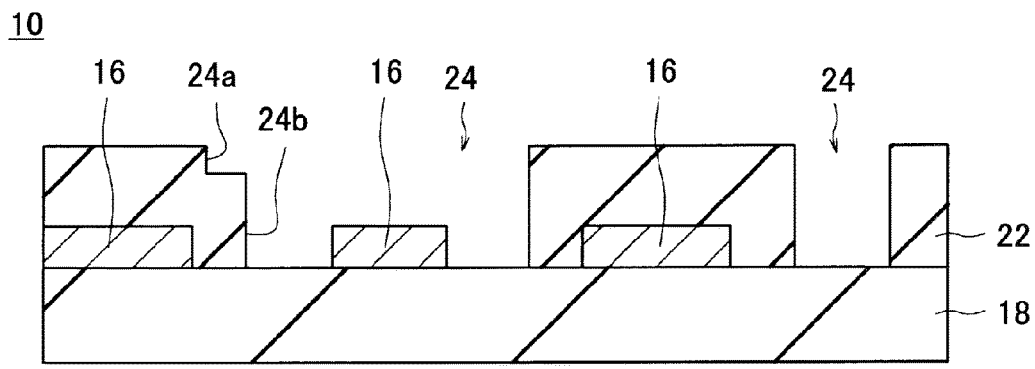
FIG. 18 is a schematic cross sectional view of the main portion of a variation of the wiring substrate according to the third embodiment of the present invention.

Furthermore, according to the present embodiment, the wiring substrate 10 as illustrated in FIG. 17 and FIG. 18 may also be manufactured. FIG. 17 and FIG. 18 are schematic cross sectional views of the main portion of a variation of the wiring substrate 10 according to the present embodiment. As with the variations in FIG. 17 and FIG. 18, the specific-shaped resin opening 24 and the resin recess 36 may be combined.

In the foregoing, the present invention has been specifically described based on the embodiments. However, it is obvious that the present invention is not limited to the above described embodiments but various modifications are possible without departing from the scope of the invention.

For example, in the first embodiment, a case has been described in which the present invention is applied to a core-less substrate as a base. Not limited thereto, the present invention may be applicable also to a build-up substrate (glass epoxy substrate) made by use of a typical core substrate.

Moreover, for example, in the first embodiment, a case has been described in which the present invention is applied to a resist in the form of a dry film, the resist covering the first surface region and going through a patterning step. Not limited thereto, the present invention may be applicable also to a resist which directly covers the first surface region by use of a printing technique.

Moreover, for example, in the first embodiment, a case has been described in which the present invention is applied to a substrate including the first surface region wider than a wiring. Not limited thereto, the present invention may be applicable to a substrate having the first surface region narrower than a wiring, and for example, a resin opening may be formed on a wiring so as to expose the wiring, as an electrode pad, from the resin opening.

Moreover, for example, in the first embodiment, a case has been described in which a resin body in a semi-cured state is completely cured before formation of a resin opening in the resin body by removing the resist. Not limited thereto, the resin body may be completely cured after formation of the resin opening.

What is claimed is:

1. A method of manufacturing a wiring substrate, comprising the steps of:
   (a) preparing a base which includes a first surface region and a second surface region around the first surface region and which has a wiring formed thereon;
   (b) forming a resist which covers the first surface region;
   (c) covering the first and second surface regions with a resin body so as to include the resist;
   (d) exposing the resist from the resin body; and
   (e) forming a resin opening, which exposes the base in the first surface region, in the resin body by removing the exposed resist.

2. The method of manufacturing a wiring substrate according to claim 1, wherein
   in the step (d), the resin body is used in a semi-cured state; and
   after the step (d) and before the step (e), the resin body is completely cured.

3. The method of manufacturing a wiring substrate according to claim 1 wherein
   in the step (b), a photosensitive resin is used as the resist; and
   in the step (c), a thermosensitive resin is used as the resin body.

4. The method of manufacturing a wiring substrate according to claim 1, wherein
   the step (a) prepares the substrate in which an electrode pad electrically connected to the wiring is formed in the first surface region; and
   the step (e) exposes the electrode pad from the resin opening.

5. The method of manufacturing a wiring substrate according to claim 1, further comprising the step of
   (f) after the step (c) and before the step (d), forming a mask having a first opening above the first surface region, on the resin body, wherein
   the step (d) removes the resin body from the first opening until exposing the resist; and
   after the step (d), the mask is removed.

6. The method of manufacturing a wiring substrate according to claim 5, wherein
   in the step (f), the mask having an area for the resist of the first opening larger than an area of the resist is used;
   the step (d) removes a portion of the resin body on the resist and a peripheral part of the portion; and
   the step (e) forms a step in which an opening side of the resin opening is larger than a bottom-face side thereof in the resin opening.

7. The method of manufacturing a wiring substrate according to claim 5, wherein
- the step (a) prepares the substrate which further includes a third surface region different from the first surface region and a fourth surface region around the third surface region;
- the step (c) covers the third and fourth surface regions together with the first and second surface regions with the resin body;
- the step (f) forms the mask further including a second opening above the third surface region on the resin body; and
- the step (d) removes the resin body from the second opening so as to form a resin recess in the resin body.

\* \* \* \* \*